United States Patent
Tominaga et al.

(10) Patent No.: US 8,363,420 B2
(45) Date of Patent: *Jan. 29, 2013

(54) ELECTRONIC CONTROL APPARATUS

(75) Inventors: Tsutomu Tominaga, Tokyo (JP);
Masahiro Kimata, Tokyo (JP);
Takayuki Kifuku, Tokyo (JP); Shuzo Akiyama, Tokyo (JP); Tadayuki Fujimoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 594 days.

This patent is subject to a terminal disclaimer.

(21) Appl. No.: 11/755,074

(22) Filed: May 30, 2007

(65) Prior Publication Data

US 2008/0157680 A1 Jul. 3, 2008

(30) Foreign Application Priority Data

Dec. 27, 2006 (JP) ................... 2006-352260

(51) Int. Cl.
*H01R 9/00* (2006.01)
(52) U.S. Cl. ........................... 361/775; 361/715
(58) Field of Classification Search .................. 361/775, 361/703, 760, 704, 709, 710, 715, 719; 174/250, 174/16.1, 17 R, 17.06
See application file for complete search history.

(56) References Cited

U.S. PATENT DOCUMENTS

| | | | |
|---|---|---|---|
| 4,666,545 A * | 5/1987 | DeGree et al. ................ 156/252 |
| 6,078,155 A | 6/2000 | Tominaga et al. |
| 6,573,616 B2 * | 6/2003 | Yamane .......................... 307/10.1 |
| 7,081,691 B2 | 7/2006 | Kawata |
| 7,177,153 B2 * | 2/2007 | Radosevich et al. .......... 361/699 |
| 7,491,897 B2 * | 2/2009 | Watanabe et al. ............. 174/266 |
| 7,751,193 B2 * | 7/2010 | Tominaga et al. ............. 361/715 |
| 2003/0184984 A1 | 10/2003 | Onizuka et al. |
| 2003/0206392 A1 | 11/2003 | Kawata |
| 2005/0167183 A1 * | 8/2005 | Tominaga et al. ............. 180/444 |
| 2005/0184380 A1 * | 8/2005 | Sakuma et al. ................ 257/686 |
| 2005/0258152 A1 * | 11/2005 | Kawamoto et al. ......... 219/121.62 |
| 2007/0084031 A1 * | 4/2007 | Kim et al. ..................... 29/25.03 |

FOREIGN PATENT DOCUMENTS

| | | |
|---|---|---|
| DE | 44 10 061 A1 | 9/1994 |
| DE | 199 53 191 A1 | 5/2001 |
| DE | 199 12 443 C2 | 5/2003 |
| DE | 103 02 372 A1 | 7/2003 |
| DE | 601 15 317 T2 | 8/2008 |
| JP | 7297576 A | 11/1995 |
| JP | 2003309384 A | 10/2003 |
| JP | 3644835 B2 | 2/2005 |
| JP | 2005-143193 A | 6/2005 |
| JP | 2005294252 | * 10/2005 |
| JP | 2005294252 A | 10/2005 |
| JP | 2006-049618 A | 2/2006 |

* cited by examiner

*Primary Examiner* — Yuriy Semenenko
(74) *Attorney, Agent, or Firm* — Sughrue Mion, PLLC

(57) ABSTRACT

The apparatus includes a housing, a heat sink arranged in the housing, semiconductor switching elements mounted on the heat sink and having terminals, a circuit board arranged in opposition to the heat sink and having an electronic circuit formed thereon including a control circuit for controlling the semiconductor switching elements, and a plurality of conductive plates electrically connecting the circuit board and the semiconductor switching elements to each other. The individual conductive plates are arranged along a lead-out direction in which the individual terminals of the semiconductor switching elements lead out, so that they are bonded to the individual terminals.

24 Claims, 9 Drawing Sheets

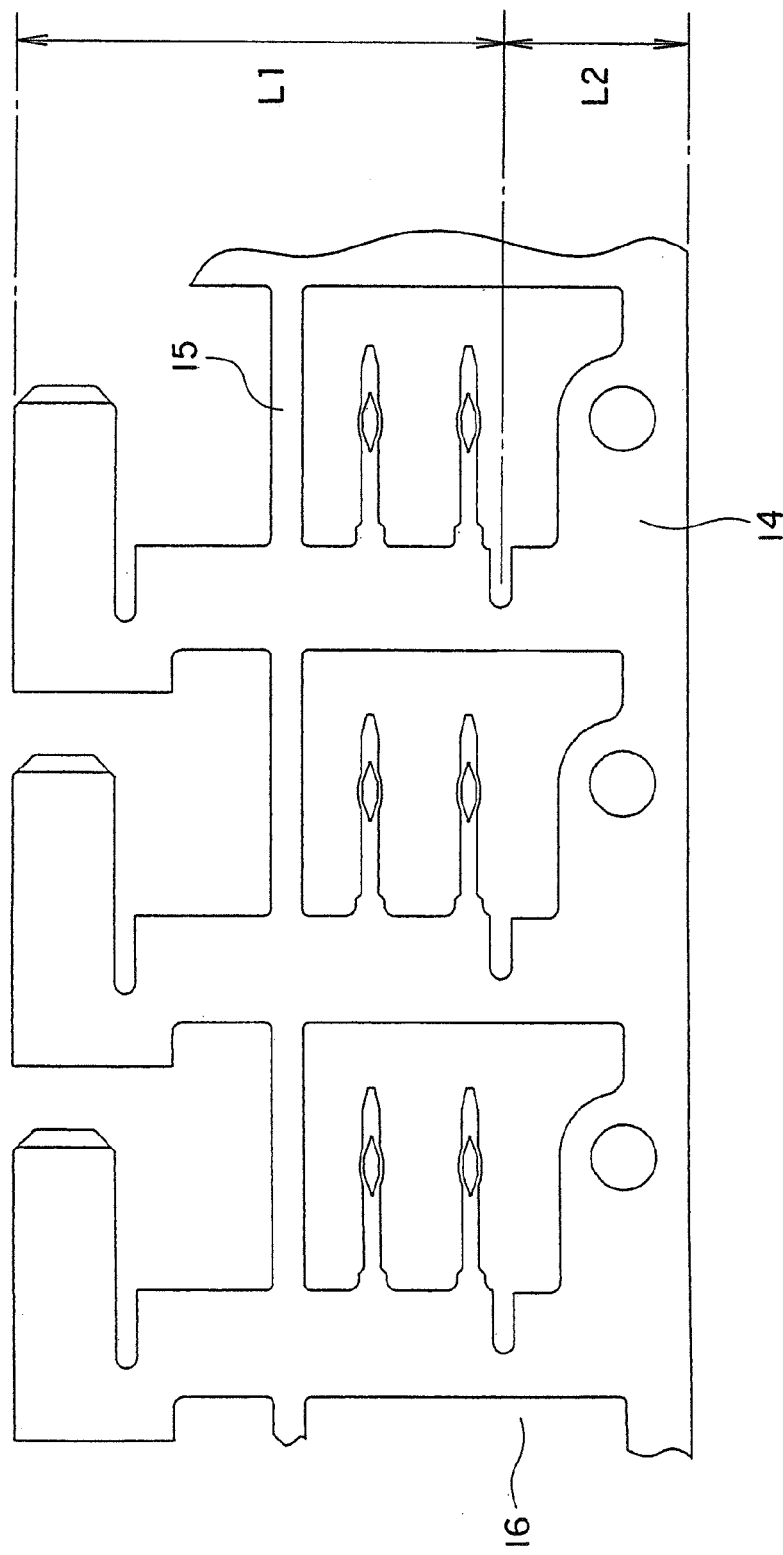

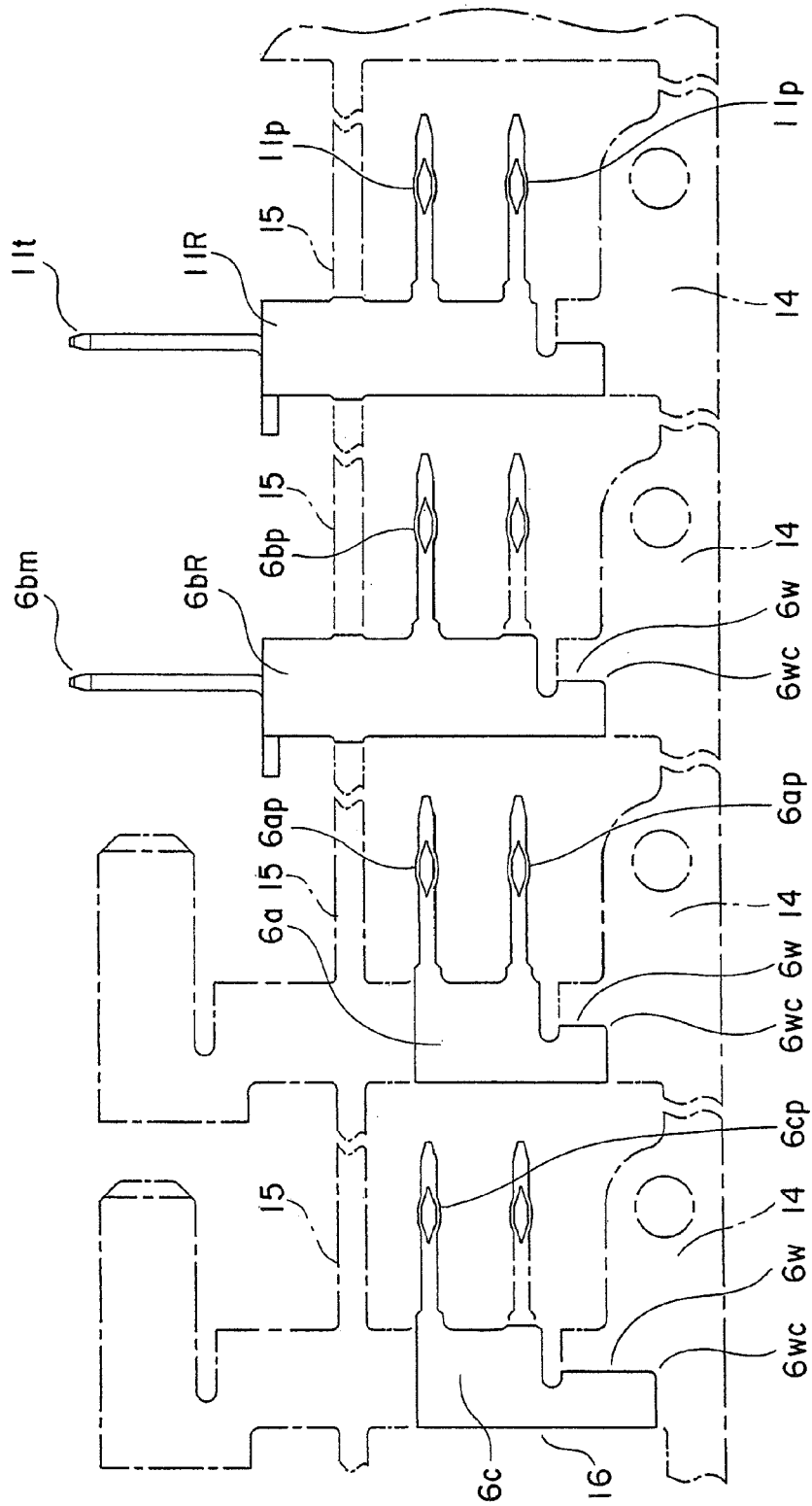

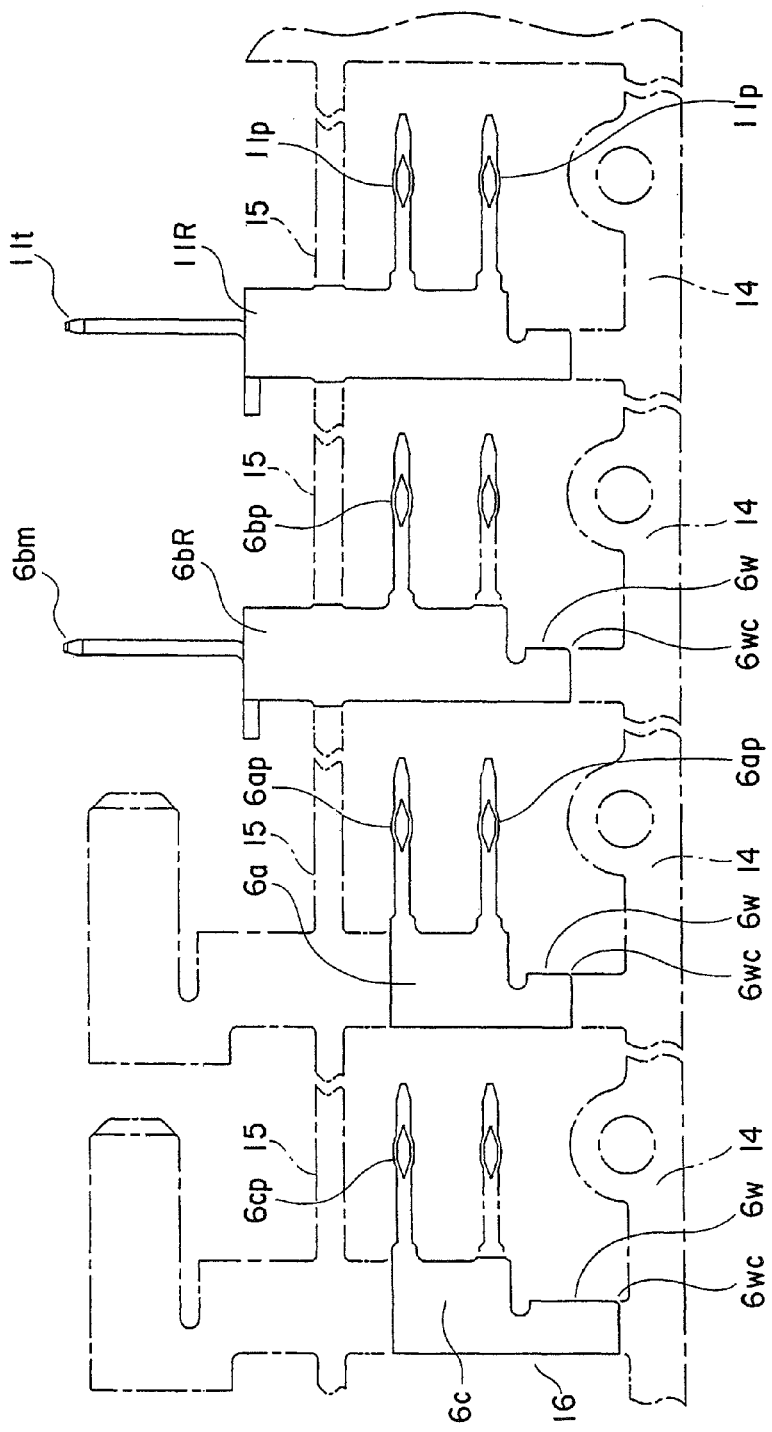

ELECTRONIC CONTROL APPARATUS

BACKGROUND OF THE INVENTION

1. Field of the Invention

The present invention relates to an electronic control apparatus used in an electric power steering system for providing an assist force to a steering system of a vehicle by means of the rotational force of an electric motor.

2. Description of the Related Art

In the past, an electronic control apparatus described in a patent document (for example, Japanese patent No. 3644835) includes a power board on which a bridge circuit comprising semiconductor switching elements are mounted for switching a current supplied to an electric motor, a housing with conductive plates, etc., insert molded into an insulating resin and having high current parts mounted thereon, a control board having low current parts such as a microcomputer, etc., mounted thereon, a connecting member for electrically connecting the power board, the housing and the control board to one another, and a heat sink.

In the electronic control apparatus thus structured, the power board on which the semiconductor switching elements are mounted is required.

Although the connecting member is fixedly secured to the power board so as not to float at the time of soldering, an impact force generated when the connecting member is fixed onto the power board is transmitted to component parts such as the semiconductor elements on the power board before soldering thereof, so there occur positional shifts of such component parts.

As a result, there is the following problem. That is, the number of parts required increases, thus making the size of the electronic control apparatus larger and the production cost thereof higher, and the reliability of soldered joints of the parts mounted on the power board is reduced.

SUMMARY OF THE INVENTION

Accordingly, the present invention is intended to obviate the problems as referred to above, and has for its object to provide an electronic control apparatus in which certain parts are eliminated so as to reduce the size and the cost of production thereof, while improving the reliability of electrical connection.

Bearing the above object in mind, an electronic control apparatus according to the present invention includes a housing, a heat sink arranged in the housing, a power device having terminals and mounted on the heat sink, a circuit board arranged in opposition to the heat sink and having an electronic circuit including a control circuit for controlling the power device, and a plurality of conductive plates electrically connecting the circuit board and the power device to each other. The individual conductive plates are arranged along a lead-out direction in which the individual terminals of the power device lead out, so as to be bonded to the terminals, respectively.

With the electronic control apparatus defined above according to the present invention, it is possible to reduce the size and the production cost of the electronic control apparatus, as well as to improve the reliability of electrical connection, etc.

The above and other objects, features and advantages of the present invention will become more readily apparent to those skilled in the art from the following detailed description of preferred embodiments of the present invention taken in conjunction with the accompanying drawings.

BRIEF DESCRIPTION OF THE DRAWINGS

FIG. 6 is a plan view showing a chained member before the conductive plates, the power supply connector terminals of FIG. 1 are produced.

FIG. 7 is a plan view showing the conductive plates, the power supply connector terminals, produced by the chained member of FIG. 6.

FIG. 9 is a plan view showing the conductive plates, the power supply connector terminals, produced by the chained member of FIG. 8.

DESCRIPTION OF THE PREFERRED EMBODIMENTS

Figure 1:
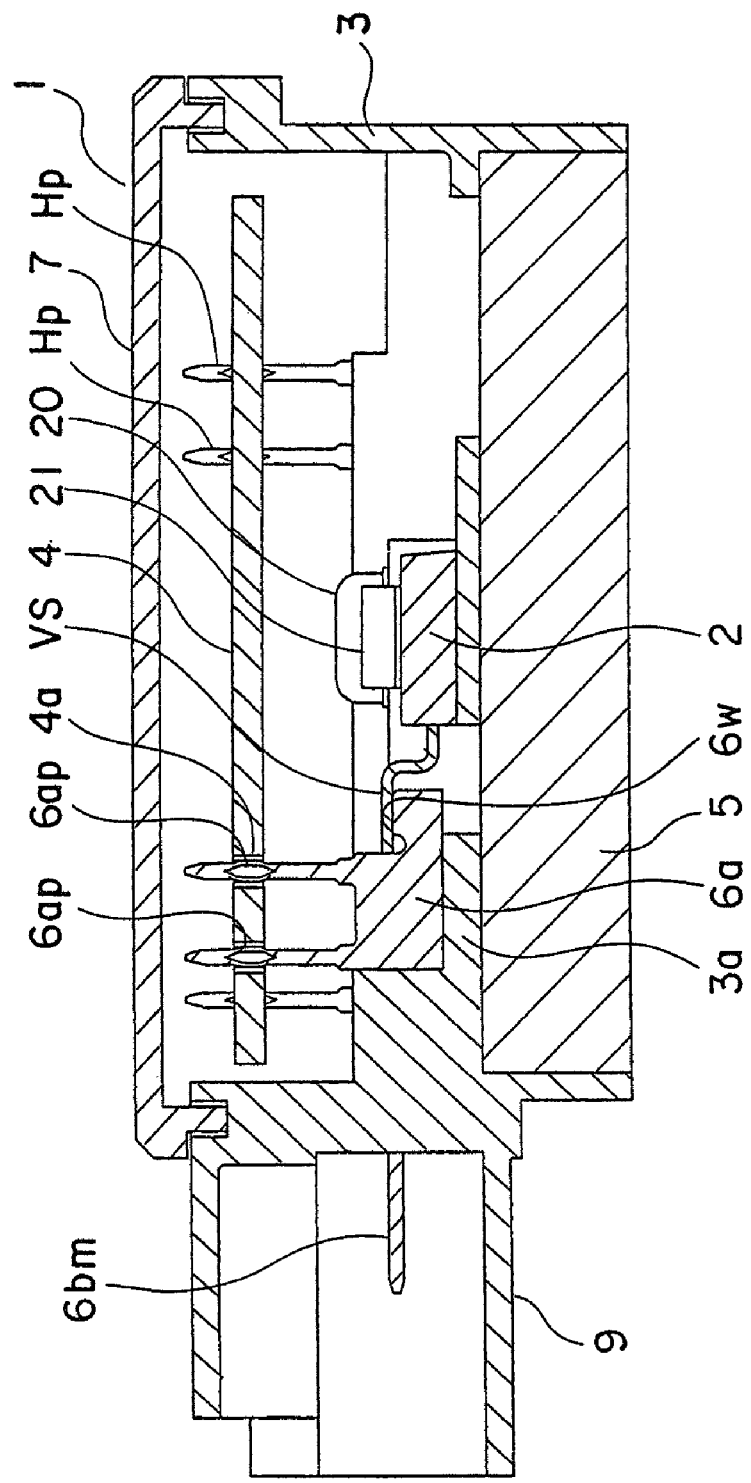
FIG. 1 is a cross sectional view showing an electronic control apparatus in an electric power steering system according to a first embodiment of the present invention.

Now, preferred embodiments of the present invention will be described in detail while referring to the accompanying drawings. Throughout respective figures, the same or corresponding members or parts are identified by the same reference numerals and characters.

Embodiment 1

In this embodiment, description will be made by taking, as an example, an electronic control apparatus used in an electric power steering system that serves to assist a steering system of a vehicle by means of the rotational force of an electric motor.

Figure 2:
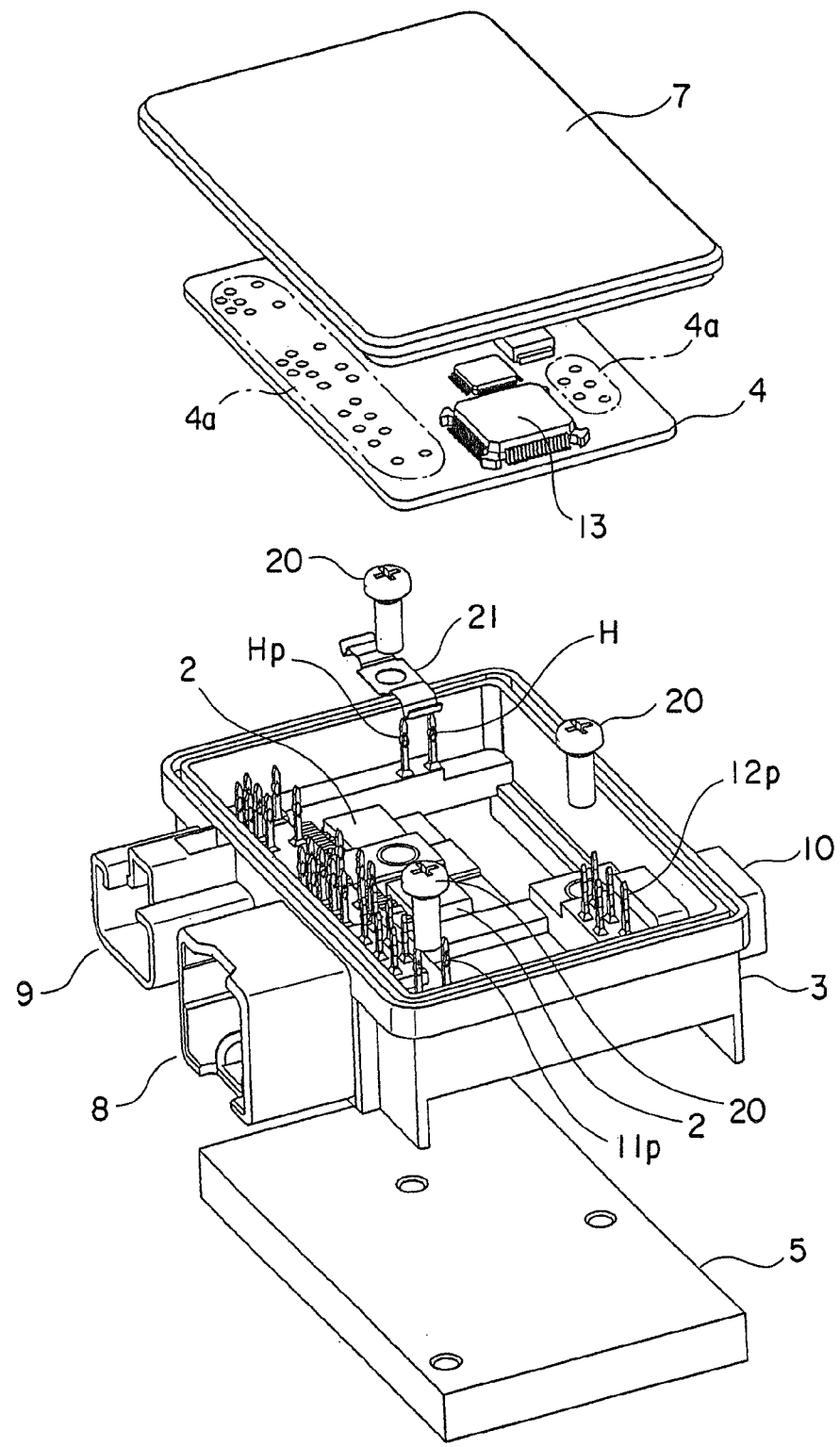
FIG. 2 is an exploded perspective view showing the electronic control apparatus in FIG. 1.
Figure 3:
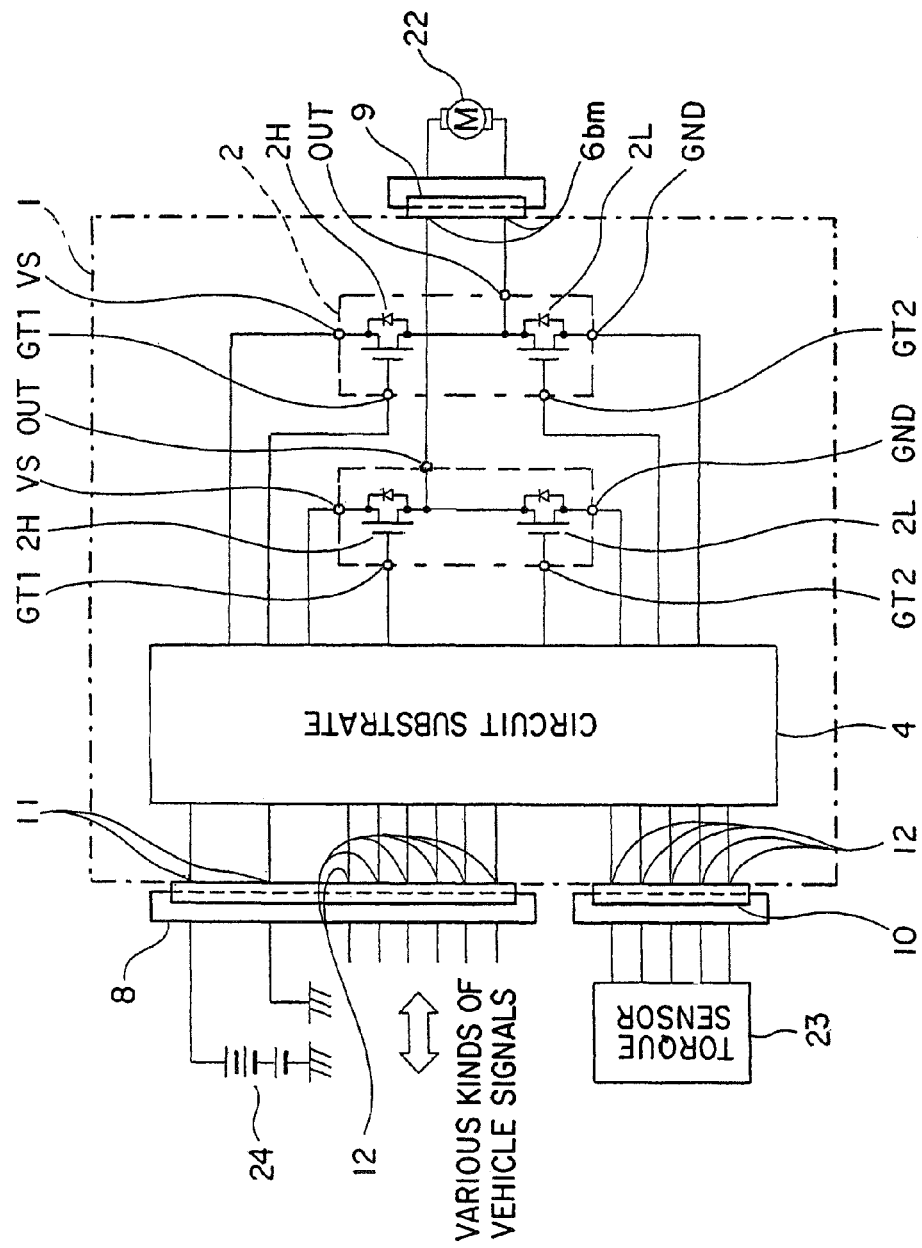
FIG. 3 is a block diagram showing the electric power steering system in FIG. 1.
Figure 4:
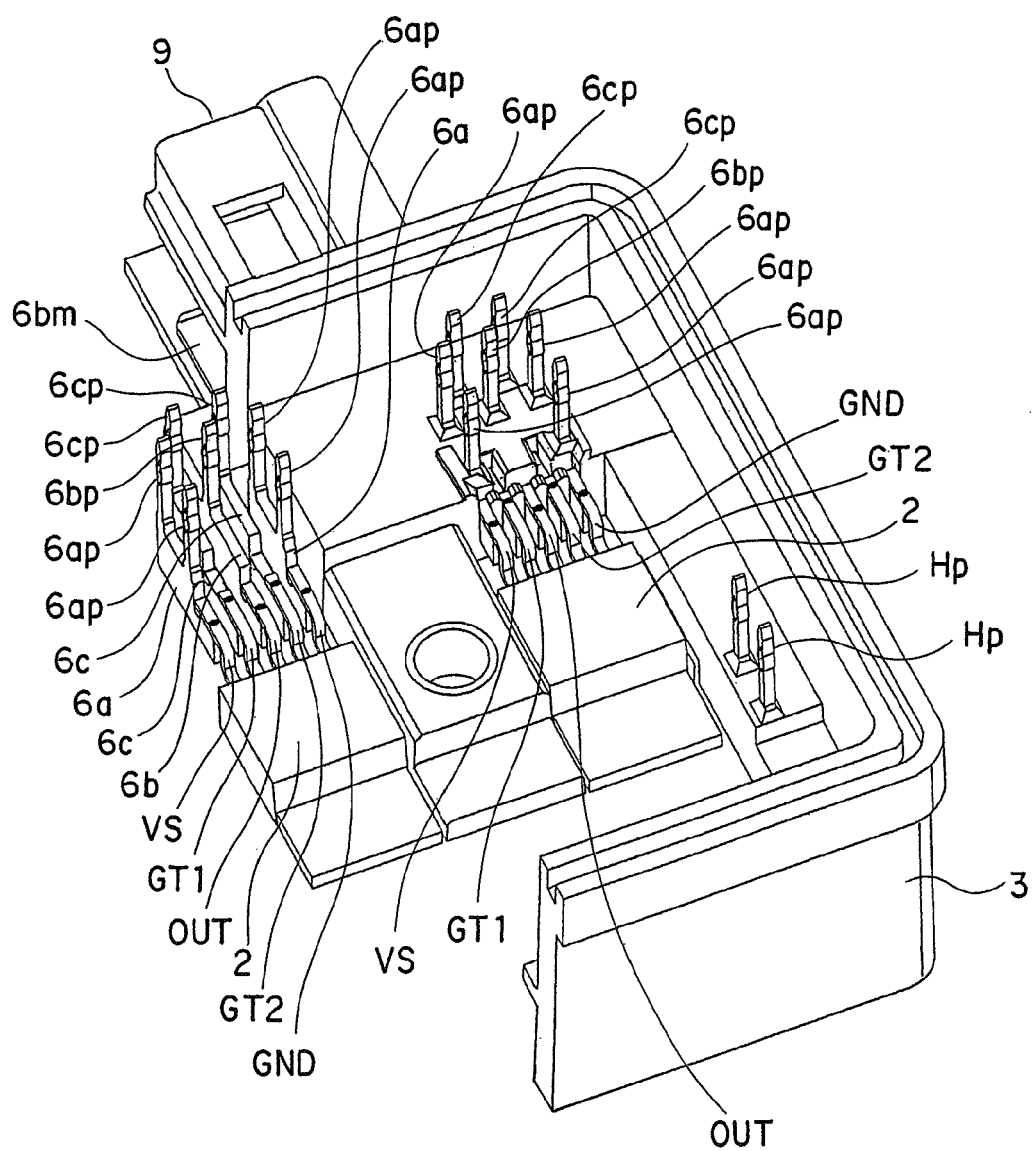
FIG. 4 is a perspective view showing the essential portions of the electronic control apparatus of FIG. 1.

Referring to the drawings and first to FIG. 1, there is shown, in cross section, an electronic control apparatus according to a first embodiment of the present invention. FIG. 2 is an exploded perspective view showing the electronic control apparatus in FIG. 1. FIG. 3 is a block diagram showing an electric power steering system in FIG. 1. FIG. 4 is a perspective view showing the essential portions of the electronic control apparatus of FIG. 1.

The electronic control apparatus 1 includes: a box-shaped housing 3 having a pair of opening portions formed at its opposite sides, respectively; a heat sink 5 that is made of aluminum and fixedly attached to one of the opening portions in the housing 3; a semiconductor switching elements 2 that is mounted on the heat sink 5 and serve as a power device; a circuit board 4 that is arranged in opposition to the heat sink 5, and has an electronic circuit formed thereon including a control circuit for controlling the semiconductor switching element 2; a power conductive plate 6a, an output conductive plate 6b and a signal conductive plate 6c that electrically connect the circuit board 4 and the semiconductor switching element 2 to each other; and a cover 7 that covers the circuit board 4 and is fixedly attached to the other opening portion in the housing 3.

Each of the semiconductor switching elements 2 has a high side MOSFET 2H and a low side MOSFET 2L integrated with each other to form a half bridge, as shown in FIG. 3. In each of the semiconductor switching elements 2, the half bridge thus formed is received in one package, and a pair of half bridges form a bridge circuit for switching a current supplied to the electric motor 22.

The individual terminals of the semiconductor switching element 2 are arranged in a side by side relation from the left side to the right side in the order of a power supply terminal VS, a gate terminal GT1 and a bridge output terminal OUT of the high side MOSFET 2H, and a gate terminal GT2 and a ground terminal GND of the low side MOSFET 2L in FIG. 4.

Here, note that the power supply terminal VS, the bridge output terminal OUT and the ground terminal GND of each semiconductor switching element 2 are large current terminals through which a large current for the electric motor 22 flows, whereas the gate terminal GT1 and the gate terminal GT2 of each semiconductor switching element 2 are small current terminals through which a small current for a signal flows, and the large current terminals and the small current terminals are arranged in an alternate manner.

In addition, the individual terminals VS, GT1, OUT, GT2, GND of the semiconductor switching elements 2 respectively lead out or extend in the same direction with the same shape to upstand vertically and then bend perpendicularly at two locations of their intermediate portions.

The housing 3 is integrated with the power conductive plates 6a, the output conductive plates 6b and the signal conductive plates 6c by insert molding of an insulating resin 3a.

At one side surface of the housing 3, there are arranged a vehicle connector 8 electrically connected to wiring for the vehicle, and an output connector in the form of a motor connector 9 electrically connected to an electric motor 22. Also, at the other side surface of the housing 3, there is a sensor connector 10 electrically connected to a torque sensor 23. When the housing 3 is formed by insert molding, the vehicle connector 8, the motor connector 9 and the sensor connector 10 are simultaneously integrated through molding with power supply connector terminals 11, motor connector terminal portions 6bm of the output conductive plate 6b and sensor connector terminals 12, respectively.

A microcomputer 13 is mounted on a wiring pattern on the circuit board 4 by soldering. Though not illustrated in FIG. 2, mounted on the wiring pattern on the circuit board 4 by soldering are a coil for preventing electromagnetic noise generated upon switching operation of the semiconductor switching elements 2 from flowing out to the outside, capacitors for absorbing ripples of motor current, a motor current detection circuit including shunt resistors, peripheral circuit elements, and so on.

Also, in the circuit board 4, there are formed a plurality of through holes 4a which have copper plating applied to their inner surfaces and are electrically connected to the wiring pattern.

Each of the power conductive plates 6a has a basal end portion connected to a tip end of the power supply terminal VS and a tip end of the ground terminal GND of a corresponding semiconductor switching element 2, respectively. The output conductive plate 6b has a basal end portion connected to a tip end of the bridge output terminal OUT. The signal conductive plate 6c has a basal end portion connected to tip ends of the gate terminals GT1, GT2, respectively.

These conductive plates 6a, 6b, 6c extend in a lead-out direction in which the terminals VS, GT1, OUT, GT2, GND of the semiconductor switching elements 2 lead out, so as to be arranged in an overlapped manner, and are bonded thereto by laser welding.

These conductive plates 6a, 6b, 6c are formed with press-fit terminal portions 6ap, 6bp, 6cp, respectively, and the press-fit terminal portions 6ap, 6bp, 6cp are press-fitted into the individual through holes 4a, respectively, in the circuit board 4, so that the terminals VS, GT1, OUT, GT2, GND of the semiconductor switching elements 2 are electrically connected to the wiring pattern of the circuit board 4.

The conductive plates 6a, 6b, 6c are made of a material of good electrical conductivity such as copper or copper alloy in consideration of electrical conductivity for supplying a large current and the mechanical strength required to form the press-fit terminal portions 6ap, 6bp, 6cp.

In addition, the output conductive plate 6b is formed at its tip end with the motor connector terminal portion 6bm, so that the motor current from the bridge output terminal OUT of the semiconductor switching elements 2 flows directly to the electric motor 22 via the motor connector terminal portion 6bm without passing through the circuit board 4. The output conductive plate 6b is formed at its intermediate portion with the press-fit terminal portion 6bp extending toward the circuit board 4, so that a signal to monitor the voltage of the motor connector terminal portion 6bm is output from the press-fit terminal portion 6bp to the circuit board 4.

The terminals VS, GT1, OUT, GT2, GND of the semiconductor switching elements 2 are formed in such a manner that they have a width of 0.8 mm, a thickness of 0.5 mm and an interval between adjacent terminals of 1.7 mm. In each of the terminals VS, OUT, GND where a large current flows, the electrical resistance thereof becomes larger in accordance with the increasing length thereof, so the generation of heat increases.

In this first embodiment of the present invention, to suppress the generation of heat, the welding between the power supply terminals VS and the power conductive plates 6a, the welding between the ground terminals GND and the power conductive plates 6a, and the welding between the bridge output terminals OUT and the output conductive plates 6b are respectively performed at locations close to the semiconductor switching elements 2, respectively.

In addition, the interval between the adjacent individual terminals VS, GT1, OUT, GT2, GND is narrow, so in order to prevent a short circuit between the terminals VS, GT1, OUT, GT2, GND, the welding positions of the gate terminals GT1 and the signal conductive plates 6c, and the welding positions of the gate terminals GT2 and the signal conductive plates 6c are not close to the individual welding positions where the welding of the power supply terminals VS and the power conductive plates 6a, the welding of the ground terminals GND and the power conductive plates 6a, and the welding of the bridge output terminals OUT and the output conductive plates 6b are respectively performed, and they are also away from the semiconductor switching elements 2 because of a small current flowing into the terminals GT1, GT2. These welding positions are indicated by filled circles in FIG. 4.

In addition, though the power conductive plates 6a and the output conductive plates 6b are made of rolled copper or copper alloy, a large current flows upon welding of the rolled surfaces (the front surfaces) of the conductive plates 6a, 6b and the terminals VS, OUT, GND of the semiconductor switching elements 2, so it is necessary to increase the thickness of the conductive plates 6a, 6b.

However, it is difficult to increase the thickness of the conductive plates 6a, 6b from the viewpoint of the formation of the press-fit terminal portions and the press working thereof.

In this first embodiment, the thickness of the conductive plates 6a, 6b, being power conductive plates, is set to 0.8 mm, which is the same as the width of the terminals VS, OUT, GND, so that the width of the conductive plates 6a, 6b is formed wider than the thickness thereof, and the terminals VS, OUT, GND of the semiconductor switching elements 2 are welded to the end faces of the conductive plates 6a, 6b orthogonal to the rolled surfaces thereof.

That is, the conductive plates 6a, 6b are formed in such a manner that they have a size or length in a direction of connection to the terminals VS, OUT, GND larger than that (widthwise direction) in a direction orthogonal to the direction of connection.

Here, note that a small current flows through the signal conductive plates 6c, so there is no need to consider the reduction in the electrical resistance of the signal conductive plates 6c, which are, however, formed of a plate material similar to that for the power conductive plates 6a and the output conductive plates 6b.

Each of the power conductive plates 6a is formed with two press-fit terminal portions 6ap; each of the output conductive plates 6b is formed with one press-fit terminal portion 6bp; and each of the signal conductive plates 6c is formed with one press-fit terminal portion 6cp. Thus, seven press-fit terminal portions 6ap, 6bp, 6cp are arranged for one semiconductor switching element 2.

The distance between the adjacent terminals VS, GT1, OUT, GT2, GND of the semiconductor switching elements 2 is 1.7 mm, as previously stated, and the hole-diameter of the through holes 4a in the circuit board 4 into which the press-fit terminal portions 6ap, 6bp, 6cp are press-fitted is formed to be 1.45 mm.

In this first embodiment, the press-fit terminal portions 6ap, 6bp, 6cp of the adjacent conductive plates 6a, 6b, 6c are arranged in a staggered manner, so that the distance between the adjacent press-fit terminal portions 6ap, 6bp, 6cp is set longer than the distance between the adjacent terminals VS, GT1, OUT, GT2, GND of the semiconductor switching elements 2.

Moreover, the insulating resin 3a of the housing 3 is interposed between the power conductive plate 6a and the heat sink 5, between the output conductive plates 6b and the heat sink 5, and between the signal conductive plates 6c and the heat sink 5, respectively.

Further, the power supply connector terminals 11 of the vehicle connector 8 are made of copper or copper alloy having a thickness of 0.8 mm, similar to the conductive plates 6a, 6b, 6c, and are each formed with two press-fit terminal portions 11p. In addition, the power supply connector terminals 11 are identical with the output conductive plates 6b except for the number of the press-fit terminal portions 11p.

The motor connector 9 and the vehicle connector 8 are arranged in parallel to each other, as shown in FIG. 2, and the output conductive plates 6b and the power supply connector terminals 11 are respectively arranged in pair in bilateral symmetry, as shown in FIG. 6.

Figures 5A, 5B:
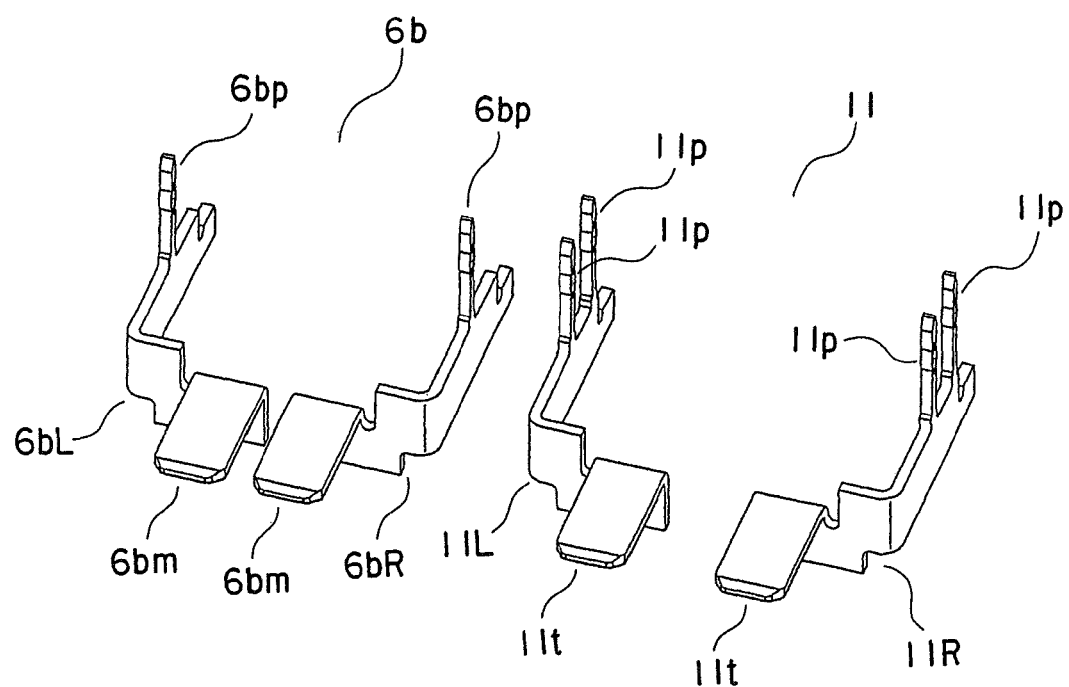
FIG. 5 is a perspective view showing the output conductive plate, the power supply connector terminal of FIG. 4.

In FIG. 5, a right output conductive plate 6bR and a left output conductive plate 6bL are formed identical to each other in their shapes when developed, but with the their directions of bending being changed from each other.

Similarly, though a right power supply connector terminal 11R and a left power supply connector terminal 11L are formed identical to each other in their shapes when developed, their directions of bending are changed from each other.

The conductive plates 6a, 6b, 6c and the power supply connector terminal 11, all of which are formed of the plate material having a thickness of 0.8 mm, include six kinds of plates and terminals comprising the power conductive plates 6a, the right output conductive plates 6bR, the left output conductive plates 6bL, the signal conductive plates 6c, the right power supply connector terminals 11R and the left power supply connector terminals 11L.

As shown in FIG. 6 and FIG. 7, these six kinds of conductive plates 6a, 6b, 6c and the power supply connector terminals 11 are formed of a same elongated chained member 16.

This chained member 16 has the conductive plates 6a, 6b, 6c and the power supply connector terminals 11 connected to one another by connecting portions 14, 15. The chained member 16 is produced by feeding elongated copper plates or copper alloy plates in succession and punching them by means of a press machine equipped with a pair of upper and lower progressive stamping dies.

The chained member 16 thus formed by punching of the press machine is plated in a continuous plating bath. The entire surface of the chained member 16 is plated with a nickel underplating of 1 to 4 μm, after which a tin plating of 0.5 μm is applied to the press-fit terminal portions 6ap, 6bp, 6cp, 11p, and a tin plating of 1 to 3 μm is applied to the motor connector terminal portions 6bm and tab portions 11t of the power supply connector terminals 11.

The thus plated chained member 16 is cut by a cutting die (not shown) at desired positions, so that the power conductive plates 6a, the output conductive plates 6b, the signal conductive plates 6c and the power supply connector terminals 11 are formed.

In FIG. 7(A), those parts which are indicated by alternate long and short dash lines are the portions of the chained member 16 to be cut, and an upper part including the connecting portions 15 of the chained member 16 and a lower part including the connecting portions 14 are cut. Then, a lower one of a pair of press-fit terminal portions 6cp is cut to form a signal conductive plate 6c. In cutting the lower part of the chained member 16, there is formed a weld portion 6w in the form of a bonding surface concurrently with cutting.

Similarly, as shown in FIG. 7(B), the chained member 16 is cut to form a power conductive plate 6a including a weld portion 6w, similar to the signal conductive plate 6c. Here, note that the power conductive plate 6a is different from the signal conductive plate 6c in that it has a pair of press-fit terminal portions 6ap.

In addition, as shown in FIG. 7(C), those parts which are indicated by alternate long and short dash lines are removed, and a motor connector terminal portion 6bm is bent at right angles at two locations, whereby a right output conductive plate 6bR in FIG. 5 is formed. Also, a left output conductive plate 6bL in FIG. 5 is formed, similar to the right output conductive plate 6bR, only with a difference in the direction of bending.

Similarly, as shown in FIG. 7(D), those parts which are indicated by alternate long and short dash lines are removed, and the remaining part is bend at right angles at two locations to form a tab portion 11t, whereby a right power supply connector terminal 11R in FIG. 5 is formed.

Also, a left power supply connector terminal 11L in FIG. 5 is formed, similar to the right power supply connector terminal 11R, with only a difference in the direction of bending.

After plating of the power conductive plates 6a, the output conductive plates 6b and the signal conductive plates 6c, the weld portions 6w are cut by the cutting die (not shown), so the weld portions 6w are welded to the terminals VS, GT1, OUT, GT2, GND of the semiconductor switching elements 2 by means of laser welding with the absence of plated layers.

The sensor connector terminals 12 of the sensor connector 10 arranged in opposition to the vehicle connector 8 are each formed of a phosphor bronze plate having a thickness of 0.64 mm, and each have a press-fit terminal portion 12p formed at one end thereof.

In addition, as shown in FIG. 2, holding members H for holding the circuit board 4 are arranged in the vicinity of a side surface of the housing 3. The power conductive plates 6a are used as the holding members H as they are, so the holding members H are identical with the power conductive plates 6a, and have press-fit terminal portions Hp formed at their tip ends, respectively.

Here, note that the holding members H only function to hold the circuit board 4, but are not electrically connected to the circuit board 4.

Now, reference will be made to a procedure of assembling the electronic control apparatus 1, as constructed above.

First of all, a cream solder is coated on the circuit board 4, and then parts such as the microcomputer 13, its peripheral circuit elements, etc., are arranged on the circuit board 4 thus coated with the cream solder, after which the cream solder is melted by using a reflow device so that the individual parts are soldered to the circuit board 4.

Then, as shown in FIG. 2, the housing 3 is arranged on the heat sink 5 and fixedly secured thereto by screws 20. Thereafter, the semiconductor switching elements 2 are arranged on the heat sink 5, the semiconductor switching elements 2 are placed in intimate contact with the heat sink 5 and fixedly secured thereto by using a flat spring 21 and the screws 20.

Subsequently, a laser beam is irradiated from the terminal (VS, GT1, OUT, GT2, GND) side of the semiconductor switching elements 2, whereby the terminals VS and the power conductive plates 6a, the terminals GT1 and the signal conductive plates 6c, the terminals OUT and the output conductive plates 6b, the terminals GT2 and the signal conductive plates 6c, and the terminals GND and the power conductive plates 6a are respectively welded to each other by means of laser welding.

Then, the circuit board 4 is mounted onto an upper portion of the housing 3 with the tip ends of the press-fit terminal portions 6ap, 6bp, 6cp, 11p, 12p, Hp being inserted into the through holes 4a in the circuit board 4. Thereafter, the press-fit terminal portions 6ap, 6bp, 6cp, 11p, 12p, Hp are press-fitted into the through holes 4a, respectively, by means of a press machine.

Thereafter, the cover 7 is arranged in the aperture of the housing 3, and the housing 3 and the cover 7 are welded to each other by the ultrasonic welding machine, whereby the assembly of the electronic control apparatus 1 is completed.

As described in the foregoing, the electronic control apparatus according to this first embodiment includes the housing 3, the heat sink 5 that is arranged in the housing 3, the semiconductor switching elements 2 that are mounted on the heat sink 5, the circuit board 4 that is arranged in opposition to the heat sink 5 and has the electronic circuit formed thereon including the control circuit for controlling the semiconductor switching elements 2, and the plurality of conductive plates 6a, 6b, 6c that electrically connect the circuit board 4 and the semiconductor switching elements 2 to each other.

Accordingly, it becomes unnecessary to use a metal board or the like conventionally required on which the semiconductor switching elements 2 are to be mounted, so the apparatus 1 can be reduced in size and cost.

In addition, the conductive plates 6a, 6b, 6c are arranged in the lead-out direction in which the terminals VS, GT1, OUT, GT2, GND of the semiconductor switching elements 2 lead out, so that the conductive plates 6a, 6b, 6c are bonded to the terminals VS, GT1, OUT, GT2, GND.

As a result, the individual terminals VS, GT1, OUT, GT2, GND, being formed of elongated thin plates and hence having large electrical resistance, can be made shorter, so it becomes possible to reduce the electrical resistance between the terminals VS, GT1, OUT, GT2, GND and the circuit board 4, thereby making it possible to suppress the generation of heat due to the electrical resistance. That is, the electronic control apparatus 1 capable of controlling a large current can be obtained.

Further, the heat sink 5 and the circuit board 4 are arranged side by side, the circuit board 4 can be assembled in a superposed manner from just above the heat sink 5, and hence the assembling efficiency thereof can be improved.

Furthermore, the individual terminals VS, GT1, OUT, GT2, GND of the semiconductor switching elements 2 are bonded by welding to the individual conductive plates 6a, 6b, 6c, so the individual terminals VS, GT1, OUT, GT2, GND and the conductive plates 6a, 6b, 6c are melted to be mutually bonded to each other, thus making it possible to improve the reliability of the bonding.

In addition, the conductive plates 6a, 6b, 6c are formed of a copper material or a copper alloy material, so the electrical resistance between the terminals VS, GT1, OUT, GT2, GND of the semiconductor switching elements 2 and the circuit board 4 becomes small, thus making it possible to suppress the generation of heat.

In addition, the conductive plates 6a, 6b, 6c are formed in such a manner that their size or length in the direction of connection with the terminals VS, GT1, OUT, GT2, GND is larger than the thickness of the terminals VS, GT1, OUT, GT2, GND. As a result, the sectional area of each path through which current flows becomes large, so the electrical resistance thereof is reduced, thus making it possible to suppress the generation of heat.

Also, laser welding is performed by irradiating a laser beam from a terminal (VS, GT1, OUT, GT2, GND) side of the semiconductor switching elements 2 having a thin thickness. Thus, welding can be carried out with a small amount of energy, and it is possible to perform excellent laser welding without any scrape, groove or the like. Accordingly, the reliability of electrical bonding can be improved.

Moreover, the conductive plates 6a, 6b, 6c are formed with the press-fit terminal portions 6ap, 6bp, 6cp, respectively, and at the same time the circuit board 4 are formed with the through holes 4a having their plated inner surfaces, wherein the press-fit terminal portions 6ap, 6bp, 6cp are press-fitted into the through holes 4a in the circuit board 4, whereby the terminals VS, GT1, OUT, GT2, GND of the semiconductor switching elements 2 are electrically connected to the wiring pattern of the circuit board 4.

Accordingly, the terminals VS, GT1, OUT, GT2, GND and the circuit board 4 are connected with each other under pressure contact therebetween due to the press fitting of the terminals VS, GT1, OUT, GT2, GND into the through holes 4a, so the resistance to thermal stress of the apparatus can be improved, thereby enhancing the reliability thereof.

Further, the electrical connection between the conductive plates 6a, 6b, 6c and the circuit board 4 are carried out only by press-fitting, so the time of assembly can be shortened and the equipment for assembly can be made simple, thus improving the assemblability of the apparatus.

Similarly, the press-fit terminal portions 11p of the power supply connector terminals 11 and the press-fit terminal portions 12p of the sensor connector terminals 12 of the sensor connector 10 are also press-fitted into the through holes 4a in the circuit board 4, whereby they are electrically connected to the wiring pattern of the circuit board 4.

Accordingly, the power supply connector terminals 11 and the sensor connector terminals 12 are connected with the circuit board 4 under pressure contact due to the press fitting, so the resistance to thermal stress of the apparatus can be improved, thereby enhancing the reliability and assemblability thereof.

In addition, the conductive plates 6a, 6b, 6c are held by the insulating resin 3a of the housing 3 integrally molded therewith, so the working efficiency of welding of the conductive plates 6a, 6b, 6c and the terminals VS, OUT, GND of the semiconductor switching elements 2 can be improved.

Moreover, the insulating resin 3a of the housing 3 is interposed between the power conductive plates 6a and the heat sink 5, between the output conductive plates 6b and the heat sink 5, and between the signal conductive plates 6c and the heat sink 5, respectively, so when the through holes 4a in the circuit board 4 are press-fitted over the press-fit terminal portions 6ap, 6bp, 6cp, a press fitting force is received by the heat sink 5 through the insulating resin 3a.

Accordingly, the positional accuracy in the press-fitting direction of the press-fit terminal portions 6ap, 6bp, 6cp with respect to the through holes 4a can be improved, and the reliability of the electrical bonding therebetween can also be improved. In addition, the working efficiency can be improved.

Further, the press-fit terminal portions 6ap, 6bp, 6cp of the adjacent conductive plates 6a, 6b, 6c are arranged in a staggered manner, so the distance between the adjacent press-fit terminal portions 6ap, 6bp, 6cp is longer than the distance between the adjacent terminals VS, GT1, OUT, GT2, GND of the semiconductor switching elements 2.

Accordingly, the distance between the inner surfaces of the adjacent through holes 4a becomes longer, whereby damage to the insulating resin between the adjacent through holes 4a can be prevented, and hence the reliability to the insulation performance can be improved.

Furthermore, the output conductive plates 6b are formed at their tip ends with the motor connector terminal portions 6bm, respectively, so that motor current from the bridge output terminals OUT of the semiconductor switching elements 2 flows directly to the electric motor 22 via the motor connector terminal portions 6bm without passing through the circuit board 4.

Accordingly, the path through which the motor current flows is made shorter, the electric power loss can be reduced, thereby improving the performance of the apparatus. Also, the number of connection or joint locations of the path through which the motor current flows can be reduced, so the reliability of connections of the apparatus can be improved.

In addition, the power conductive plates 6a and the output conductive plates 6b, which are high current conductive plates through which a large current flows, and the signal conductive plates 6c, which are low current conductive plates through which a small current flows, are arranged in an alternate or staggered manner. Further, the positions of welding between the power supply terminals VS and the power conductive plates 6a, the positions of welding between the ground terminals GND and the power conductive plates 6a, and the positions of welding between the bridge output terminals OUT and the output conductive plates 6b are close to the semiconductor switching elements 2, respectively. Also, the positions of welding at which the gate terminals GT1, GT2 and the signal conductive plates 6c are welded to each other are away from the semiconductor switching elements 2 so as not to be close to the positions of welding at which the power supply terminals VS and the ground terminals GND are welded to the power conductive plates 6a, and the positions of welding at which the bridge output terminals OUT and the output conductive plates 6b are welded to each other.

Accordingly, the length of the terminals VS, GND of the semiconductor switching elements 2, which are formed of elongated thin plates having large electrical resistance and through which a large current flows, becomes substantially shorter, and hence the electrical resistance between the semiconductor switching elements 2 and the circuit board 4 becomes smaller. As a result, the generation of heat can be suppressed, so the electronic control apparatus 1 capable of controlling a large current can be obtained.

Moreover, the electrical resistance between the bridge output terminals OUT and the motor connector terminal portions 6bm of the semiconductor switching elements 2 also becomes smaller, so the electric power loss can be reduced and the performance of the apparatus can be improved.

In addition, the adjacent welding positions deviate from one another, so that welding heat to be transmitted to the insulating resin 3a is distributed, as a consequence of which the degradation of the insulating resin 3a can be suppressed and the reliability of the apparatus can be improved.

Further, the conductive plates 6a, 6b, 6c and the power supply connector terminals 11 of the vehicle connector 8 are formed by cutting the connecting portions 14, 15 of the chained member 16.

Accordingly, the conductive plates 6a, 6b, 6c and the power supply connector terminals 11, being different in shape from each other, can be produced in an efficient manner, so the working efficiency can be improved.

Furthermore, the surface of the elongated chained member 16 is plated in the continuous plating bath, so plating can be efficiently carried out, thus making it possible to improve the working efficiency.

In addition, after plating of the power conductive plates 6a, the output conductive plates 6b and the signal conductive plates 6c, the weld portions 6w are cut by the cutting die, so the weld portions 6w are welded to the terminals VS, GT1, OUT, GT2, GND of the semiconductor switching elements 2 without any plated layer on the weld portions 6w.

Accordingly, there will be no dispersion of the plating of a low melting point due to the heat of welding, and hence the reliability of the bonding can be improved.

Moreover, the bonding surfaces in the form of the weld portions 6w are formed at the same time when the chained member 16 is cut to form the power conductive plates 6a, the output conductive plates 6b and the signal conductive plates 6c, so the conductive plates 6a, 6b, 6c having the weld portions 6w can be produced in an efficient manner.

In addition, in the conductive plates 6a, 6b, 6c, the connecting portions 14 are cut at positions including the weld portions 6w by means of the cutting die, so there will be no occurrence of burrs at corner portions 6wc of the weld portions 6w, and hence the contact or adhesion between the weld portions 6w and the terminals VS, GT1, OUT, GT2, GND of the semiconductor switching elements 2 can be improved, thus enhancing the reliability of welding.

Further, each of the semiconductor switching elements 2, serving as a power device, has a high side MOSFET 2H and a low side MOSFET 2L integrated with each other to form a half bridge, and in each semiconductor switching element 2, the half bridge is enclosed in one package, so the number of connections or joints between the output conductive plates 6b and the bridge output terminals OUT of the semiconductor switching elements 2 can be reduced by one. As a result, the working efficiency can be improved, and the size of the apparatus can be reduced.

Figure 8:
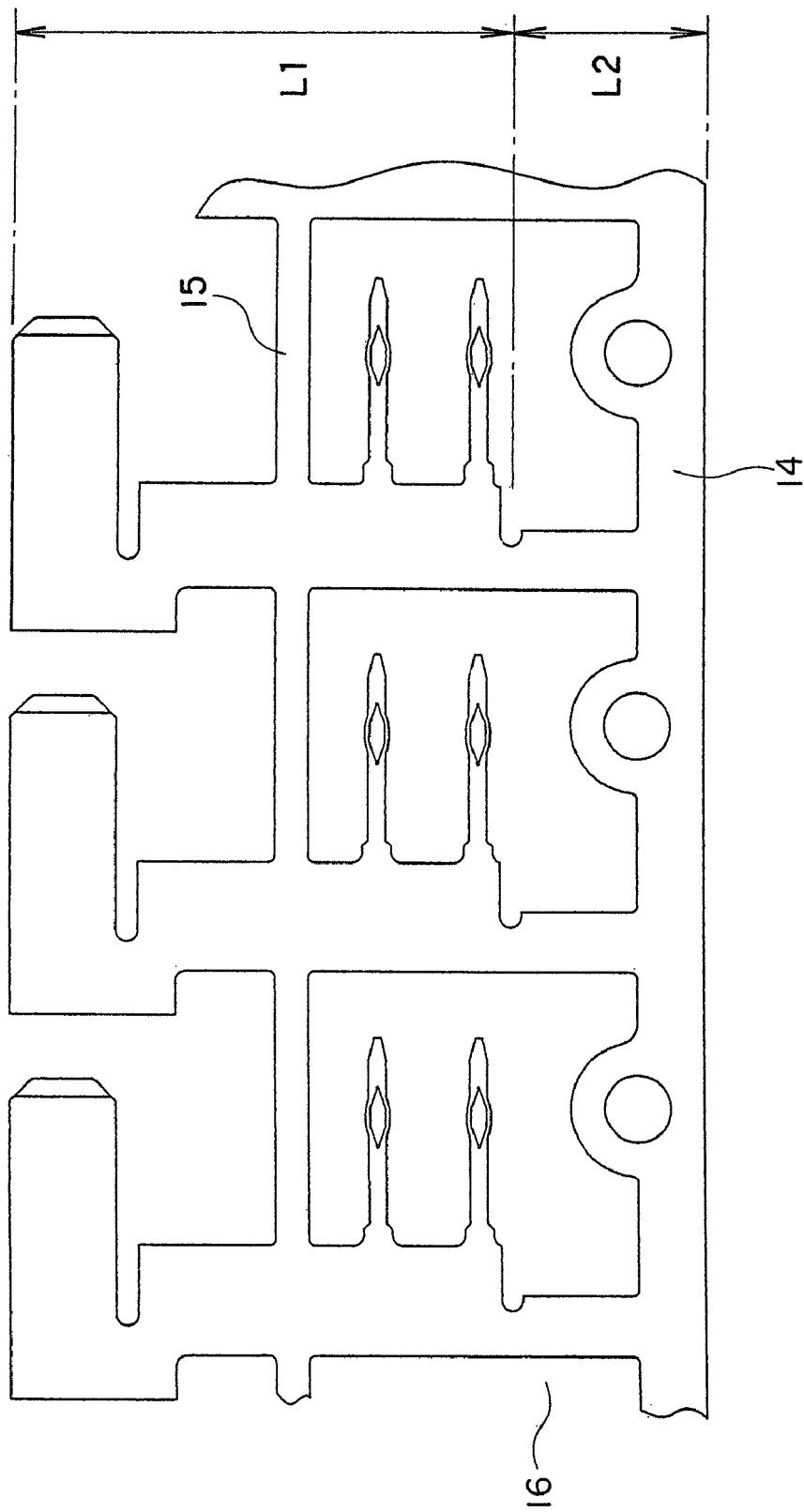
FIG. 8 is a plan view showing the chained member of configuration different from the chained member showed in FIG. 6.

In the above-mentioned embodiment, the chained member 16 is formed in a manner as shown in FIGS. 6 and 7, and the conductive plates 6a, 6b, 6c and the power supply connector terminals 11 are formed by cutting the connecting portions 14 including the weld portions 6w by means of the cutting die, but the chained member 16 may instead be formed in such a manner that the connecting portions 14 do not include any weld portion 6w, as shown in FIG. 8, and the conductive plates 6a, 6b, 6c, as shown in FIGS. 9(A), 9(C) and 9(B), and the power supply connector terminals 11, as shown in FIG. 9(D), may then be formed by cutting the connecting portions 14 by the use of the cutting die.

In this case, a process step of deburring burrs at the corners 6wc of the weld portions 6w is added.

Also, the entire surface of the chained member 16 is plated with the nickel underplating of 1 to 4 μm, after which the tin plating of 0.5 μm is applied to the press-fit terminal portions 6ap, 6bp, 6cp, 11p, and the tin plating of 1 to 3 μm is applied to the motor connector terminal portions 6bm and the tab portions 11t of the power supply connector terminals 11, but plating may instead be applied to only those parts which lie above the press-fit terminal portions 6ap, 6bp, 6cp, 11p, i.e., those parts which are designated by L1, whereas those parts which are designated by L2 may not be plated, as shown in FIGS. 6 and 8. In this case, too, the cost of plating can be reduced.

Further, although in the above-mentioned first and second embodiments, the bonding connections between the individual terminals VS, GT1, OUT, GT2, GND of the semiconductor switching elements 2 and the conductive plates 6a, 6b, 6c are made by means of laser welding, there may instead be used other welding methods such as resistance welding, TIG welding, etc. Also, ultrasonic bonding other than welding may instead be used.

Moreover, in the semiconductor switching elements 2, a half bridge having the high side MOSFET 2H and the low side MOSFET 2L integrated with each other is received in one package, and a pair of half bridges are used as one set and combined with each other to form a bridge circuit for switching the current of the electric motor 22, but the high side MOSFET 2H and the low side MOSFET 2L may be separately constructed, so that four separate or independent semiconductor switching elements 2 may be used to form such a bridge circuit. Also, six semiconductor switching elements 2 may be used to form a bridge circuit for driving and controlling a three-phase blushless motor.

Although the power device is composed of the semiconductor switching elements 2, other power devices such as diodes, thyristors, etc., may instead be used.

Further, the thickness of the conductive plates 6a, 6b, 6c is set to 0.8 mm, but other thicknesses such as 1 mm, 1.2 mm, etc., may be used as the thickness of the conductive plates 6a, 6b, 6c in consideration of the current flowing through the conductive plates 6a, 6b, 6c, the intervals between the adjacent individual terminals VS, GT1, OUT, GT2, GND of the semiconductor switching elements 2, etc.

Although the conductive plates 6a, 6b, 6c are integrated with the insulating resin 3a by means of insert molding, the conductive plates 6a, 6b, 6c may be inserted into and held by the housing 3 after molding of the housing 3.

Further more, in the above-mentioned first embodiment, reference has been made to an example in which the present invention is applied to an electric power steering system in a motor vehicle, but the present invention can be applied to an electronic control apparatus, which is provided with a power device and can handle large current (e.g., 25 A or more), such as an electronic control apparatus in an antilock brake system (ABS), an electronic control apparatus associated with air conditioning, etc.

While the invention has been described in terms of preferred embodiments, those skilled in the art will recognize that the invention can be practiced with modifications within the spirit and scope of the appended claims.

What is claimed is:

1. An electronic control apparatus comprising:
   a housing;
   a heat sink that is arranged in said housing;
   a power device that is mounted on said heat sink and has terminals which lead out in a lead-out direction;
   a circuit board that is arranged in opposition to said heat sink, and has an electronic circuit including a control circuit for controlling said power device; and
   conductive plates that electrically connect said circuit board and said power device to each other, and are arranged in the lead-out direction in which the terminals of said power device lead out, each of the conductive plates comprising:
      rolled surfaces which are disposed opposing one another and extend in the lead-out direction and toward the circuit board,
      at least one press-fit terminal which extends toward the circuit board, and
      an end face, which is orthogonal to the corresponding rolled surfaces and is parallel to the lead-out direction and faces a respective individual terminal of the power device between the corresponding rolled surfaces, and
   wherein the end faces of the conductive plates are bonded to the respective individual terminals of the power device,
   wherein said individual conductive plates include high current conductive plates through which a large current flows, and low current conductive plates through which a small current flows, and
   wherein positions of welding on said terminals for said high current conductive plates are arranged closer to said power device than the positions of welding on said terminals for said low current conductive plates.

2. The electronic control apparatus as set forth in claim 1, wherein
   said heat sink and said circuit board are arranged in parallel to each other.

3. The electronic control apparatus as set forth in claim 1, wherein
   said terminals of said power device are bonded to said conductive plates by welding.

4. The electronic control apparatus as set forth in claim 3, wherein
   said terminals of said power device are bonded to said conductive plates by laser welding.

5. The electronic control apparatus as set forth in claim 1, wherein
   said conductive plates are formed of a copper material or a copper alloy material.

6. The electronic control apparatus as set forth in claim 1, wherein
   said conductive plates have their size in a direction of connection with said terminals larger than the thickness of said terminals.

7. The electronic control apparatus as set forth in claim 1, wherein
said conductive plates have their size in a direction of connection with said terminals larger than their width orthogonal to said direction of connection.

8. The electronic control apparatus as set forth in claim 4, wherein
said laser welding is effected in such a manner that a laser beam is irradiated to surfaces of said terminals.

9. The electronic control apparatus as set forth in claim 1, wherein
said conductive plates are held by an insulating resin of said housing.

10. The electronic control apparatus as set forth in claim 9, wherein
said insulating resin is interposed between said conductive plates and said heat sink.

11. The electronic control apparatus as set forth in claim 8, wherein
said press-fit terminal portions of said conductive plates are arranged in a staggered manner.

12. The electronic control apparatus as set forth in claim 1, wherein
said high current conductive plates and said low current conductive plates being arranged in an alternate manner.

13. The electronic control apparatus as set forth in claim 12, wherein
said individual conductive plates include high current conductive plates through which a large current flows, and low current conductive plates through which a small current flows, and
said high current conductive plates have output conductive plates which are electrically connected to an external electric load and which are formed with output connector terminal portions, so that an output current from said power device flows to said electric load directly through said output connector terminal portions.

14. The electronic control apparatus as set forth in claim 1, wherein
said conductive plates are formed from a chained member, by cutting connecting portions, the chained member being constructed of said conductive plates continuously connected with one another through said connecting portions to be cut.

15. The electronic control apparatus as set forth in claim 14, wherein
said chained member has its surface applied with plating.

16. The electronic control apparatus as set forth in claim 15, wherein
said conductive plates have bonding surfaces at which said conductive plates are bonded to said terminals, with said plating being not applied to said bonding surfaces.

17. The electronic control apparatus as set forth in claim 16, wherein
said bonding surfaces are cut surfaces that are generated when said chained member is cut.

18. The electronic control apparatus as set forth in claim 1, wherein
said power device comprises a semiconductor switching element.

19. The electronic control apparatus as set forth in claim, wherein
said power device has a plurality of semiconductor switching elements built into one package.

20. The electronic control apparatus as set forth in claim 1, wherein terminal portions of said conductive plates are arranged in a staggered manner and distance between the terminal portions of said conductive plates are set longer than distance between the terminals of the power device that are adjacent.

21. The electronic control apparatus as set forth in claim 1, wherein the conductive plates comprise a power conductive plate, a signal conductive plate, and an output conductive plate.

22. The electronic control apparatus as set forth in claim 21, wherein the power conductive plate is connected to a power supply terminal of the power device and a ground terminal, the signal conductive plate is connected to a gate terminal of the power device, and the output conductive plate is connected to an output terminal of the power device.

23. The electronic control apparatus as set forth in claim 1, wherein:
one of the conductive plates has a basal end portion connected to a tip end of a power supply terminal and a tip end of a ground terminal of the power device,
the terminals of the power device have a width of approximately 0.8 mm and thickness of approximately 0.5 mm and an interval between adjacent terminals approximately 1.7 mm, and
the conductive plates have a thickness of approximately 0.8 mm.

24. An electronic control apparatus comprising:
a housing;
a heat sink that is arranged in said housing;
a power device that is mounted on said heat sink and has terminals which lead out in a lead-out direction;
a circuit board that is arranged in opposition to said heat sink, and has an electronic circuit including a control circuit for controlling said power device; and
conductive plates that electrically connect said circuit board and said power device to each other, and are arranged in the lead-out direction in which the terminals of said power device lead out, each conductive plate comprising:
rolled surfaces which are disposed opposing one another and extend in the lead-out direction and toward the circuit board, and
an end face, which is orthogonal to the corresponding rolled surfaces and is parallel to the lead-out direction, and faces a respective individual terminal of the power device between the corresponding rolled surfaces,
wherein the end faces of said conductive plates are bonded to the respective individual terminals of said power device,
wherein said circuit board has through holes formed therethrough with plating being applied to inner peripheral surfaces of the through holes,
wherein said conductive plates have press-fit terminal portions which extend toward the circuit board and are press-fitted into said through holes,
wherein said individual conductive plates include high current conductive plates through which a large current flows, and low current conductive plates through which a small current flows, and
wherein positions of welding on said terminals for said high current conductive plates are arranged closer to said power device than the positions of welding on said terminals for said low current conductive plates.

* * * * *